US009508733B1

(12) United States Patent
Lee et al.

(10) Patent No.: US 9,508,733 B1
(45) Date of Patent: Nov. 29, 2016

(54) METHODS OF FABRICATING EMBEDDED ELECTRONIC DEVICES INCLUDING CHARGE TRAP MEMORY CELLS

(71) Applicant: SK hynix Inc., Gyeonggi-do (KR)

(72) Inventors: Tae Ho Lee, Chungcheongbuk-do (KR); Young Joon Kwon, Chungcheongbuk-do (KR); Sung Kun Park, Chungcheongbuk-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/885,371

(22) Filed: Oct. 16, 2015

(30) Foreign Application Priority Data

Jun. 2, 2015 (KR) .................. 10-2015-0077821

(51) Int. Cl.
| H01L 27/115 | (2006.01) |
| H01L 21/28 | (2006.01) |
| H01L 21/02 | (2006.01) |
| H01L 21/311 | (2006.01) |
| H01L 21/265 | (2006.01) |
| H01L 21/266 | (2006.01) |
| H01L 29/51 | (2006.01) |

(52) U.S. Cl.
CPC ..... *H01L 27/11568* (2013.01); *H01L 21/0214* (2013.01); *H01L 21/0217* (2013.01); *H01L 21/0223* (2013.01); *H01L 21/02164* (2013.01); *H01L 21/266* (2013.01); *H01L 21/26513* (2013.01); *H01L 21/28282* (2013.01); *H01L 21/31144* (2013.01); *H01L 27/11573* (2013.01); *H01L 29/513* (2013.01); *H01L 29/518* (2013.01); *H01L 21/02255* (2013.01)

(58) Field of Classification Search
CPC .............. H01L 27/11568; H01L 27/11573; H01L 27/11575
See application file for complete search history.

(56) References Cited

U.S. PATENT DOCUMENTS

2010/0309729 A1\* 12/2010 Chang ............... H01L 21/28282
365/185.28

FOREIGN PATENT DOCUMENTS

KR 1020040060570 7/2004

\* cited by examiner

*Primary Examiner* — Yu-Hsi D Sun
(74) *Attorney, Agent, or Firm* — IP & T GROUP LLP

(57) ABSTRACT

A method of fabricating an embedded electronic device including charge trap memory cells that includes forming a tunnel insulation layer, a charge trap layer and a sacrificial insulation layer on a substrate having a first region and a second region. The tunnel insulation layer, the charge trap layer and the sacrificial insulation layer which are stacked on the second region of the substrate are selectively removed. A well region is formed in an upper region of the second region of the substrate. The sacrificial insulation layer remaining over the first region is removed to expose the charge trap layer remaining over the first region. A blocking insulation layer and a gate insulation layer are formed on the exposed charge trap layer over the first region and on the second region of the substrate, respectively.

8 Claims, 26 Drawing Sheets

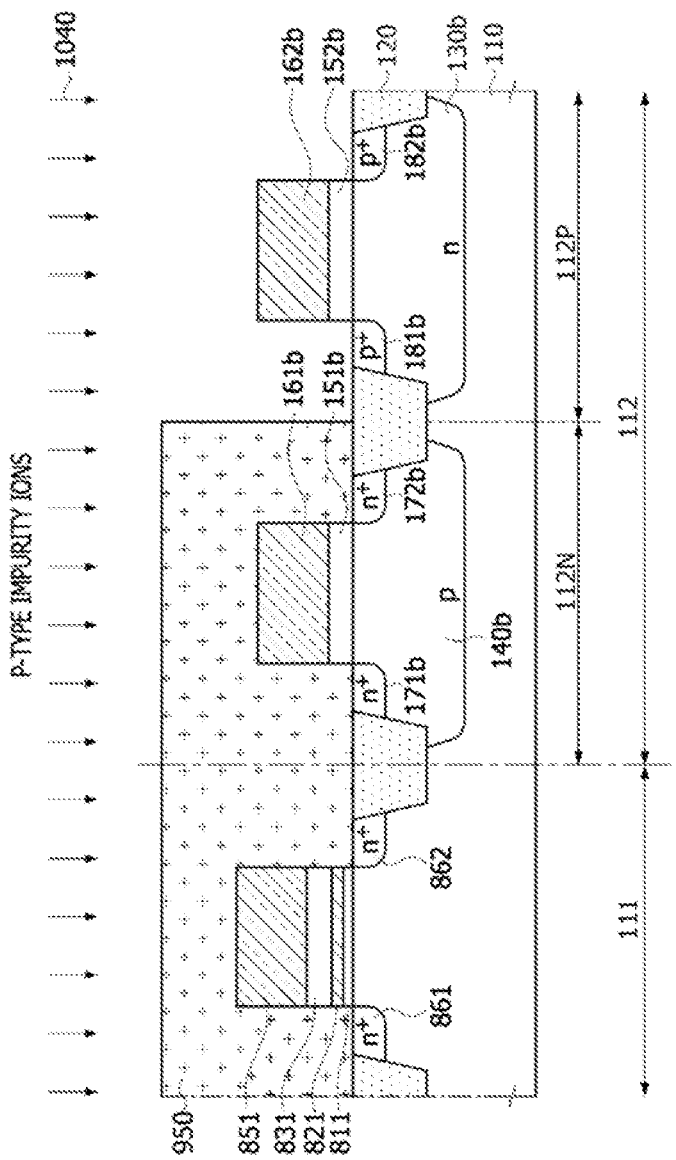

METHODS OF FABRICATING EMBEDDED ELECTRONIC DEVICES INCLUDING CHARGE TRAP MEMORY CELLS

CROSS-REFERENCE TO RELATED APPLICATION

The present application claims priority under 35 U.S.C 119(a) to Korean Patent Application No. 10-2015-0077821, filed on Jun. 2, 2015, in the Korean Intellectual Property Office, which is incorporated herein by reference in its entirety.

BACKGROUND

1. Technical Field

Various embodiments of the present disclosure relate to methods of fabricating electronic devices including nonvolatile memory devices and, more particularly, to methods of fabricating embedded electronic devices including charge trap flash memory cells.

2. Related Art

In embedded electronic devices provided in system-on-chip (SOC) package form, metal-oxide-semiconductor field effect transistors (MOSFET) may be integrated on a chip or a substrate to constitute various logic devices, interface circuits or nonvolatile memory (NVM) devices. The MOSFETs (MOS transistors) include N-channel MOS transistors (NMOS transistors) and P-channel MOS transistors (PMOS transistors), and the NMOS transistors and the PMOS transistors may constitute a complementary MOS (CMOS) circuit.

The logic devices, the Interface circuits or the nonvolatile memory (NVM) devices may be fabricated using a CMOS process. The CMOS process may include various unit processes. For example, the CMOS process may Include a deposition process for forming a conductive layer, a semiconductor layer or an insulation layer as well as an etch process for patterning the conductive layer, the semiconductor layer or the insulation layer.

The NVM device may be designed to include a plurality of NVM cells, for example, charge trap memory cells having a silicon-oxide-nitride-oxide-silicon (SONOS) type gate structure. The charge trap memory cells having a SONOS-type gate structure are referred to as SONOS memory cells. Each of the SONOS memory cells may have a stacked gate structure including a tunnel Insulation layer, a charge trap layer, an inter-gate insulation layer (a blocking insulation layer), and a control gate layer which are sequentially stacked on a semiconductor substrate. In the event that the charge trap memory cells are integrated on a substrate together with MOS transistors, the blocking insulation layer of the SONOS type gate structure may be formed while a gate insulation layer of the MOS transistors is formed. Thus, the performance of the SONOS memory cells is influenced by the CMOS process.

SUMMARY

Various embodiments are directed to methods of fabricating embedded electronic devices including charge trap memory cells.

According to one embodiment, there is provided a method of fabricating an embedded electronic device including charge trap memory cells. The method includes forming a tunnel insulation layer, a charge trap layer and a sacrificial Insulation layer on a substrate having a first region and a second region. The tunnel insulation layer, the charge trap layer and the sacrificial insulation layer which are stacked on the second region of the substrate are selectively removed. A well region is formed in an upper region of the second region of the substrate. The sacrificial insulation layer remaining over the first region is removed to expose the charge trap layer remaining over the first region. A blocking insulation layer and a gate insulation layer are formed on the exposed charge trap layer over the first region and on the second region of the substrate, respectively.

According to another embodiment, there is provided a method of fabricating an embedded electronic device including charge trap memory cells. The method includes forming a tunnel insulation layer, a charge trap layer, a first blocking insulation layer and a protection layer on a substrate having a first region and a second region. The tunnel insulation layer, the charge trap layer, the first blocking insulation layer and the protection layer stacked on the second region of the substrate are selectively removed. A well region is formed in an upper region of the second region of the substrate. The protection layer remaining over the first region is removed to expose the first blocking insulation layer remaining over the first region. A second blocking insulation layer and a gate insulation layer are formed on the exposed first blocking insulation layer over the first region and on the second region of the substrate, respectively.

According to another embodiment, there is provided a method of fabricating an embedded electronic device including charge trap memory cells. The method includes forming a tunnel insulation layer and a charge trap layer on a substrate having a first region and a second region, selectively removing the tunnel insulation layer and the charge trap layer which are stacked on the second region of the substrate, forming a well region in an upper region of the second region of the substrate, and respectively forming a blocking insulation layer and a gate insulation layer on the charge trap layer remaining over the first region and on the second region Including the well region.

BRIEF DESCRIPTION OF THE DRAWINGS

Various embodiments of the present disclosure will become more apparent in view of the attached drawings and accompanying detailed description, in which:

FIGS. 19 to 26 are cross-sectional views Illustrating a method of fabricating an embedded electronic device including charge trap memory cells according to still another embodiment.

DETAILED DESCRIPTION OF THE EMBODIMENTS

It will be understood that although the terms "first," "second," "third," etc., may be used herein to describe various elements, these elements should not be limited by these terms. These terms are only used to distinguish one element from another element. Thus, a first element in some embodiments could be termed a second element in other embodiments without departing from the teachings of the present disclosure.

It will also be understood that when an element is referred to as being located "on," "over," "above," "under," "beneath," "below" or "beside" another element, it may directly contact the other element, or at least one intervening element may be present therebetween. Accordingly, the terms such as "on," "over," "above," "under," "beneath," "below," "beside" and the like that are used for describing particular embodiments only and are not intended to limit the scope of the present disclosure.

It will be further understood that when an element is referred to as being "connected" or "coupled" to another element, it can be directly connected or coupled to the other element or intervening elements may be present.

FIGS. 1 to 9 are cross-sectional views illustrating a method of fabricating an embedded electronic device including charge trap memory cells according to an embodiment.

Figure 1:
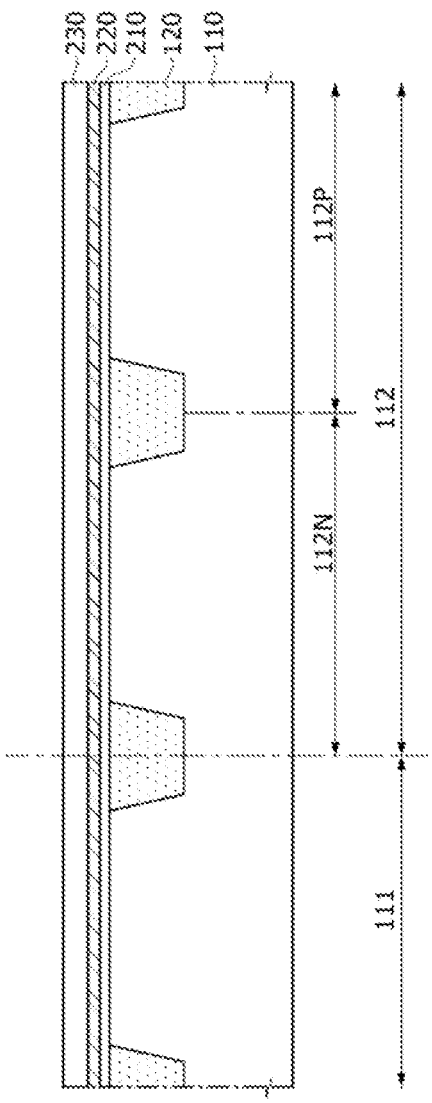
FIGS. 1 to 9 are cross-sectional views illustrating a method of fabricating an embedded electronic device including charge trap memory cells according to an embodiment.

Referring to FIG. 1, a tunnel Insulation layer 210, a charge trap layer 220 and a sacrificial insulation layer 230 may be sequentially formed on a substrate 110 having a first region 111 and a second region 112. The first region 111 may correspond to a region on which an NVM cell such as a charge trap memory cell is disposed. The second region 112 may correspond to a region on which logic devices comprised of MOS transistors are disposed. The second region 112 may include an NMOS transistor region 112N on which an NMOS transistor is formed and a PMOS transistor region 112P on which a PMOS transistor is formed. Each of the tunnel insulation layer 210, the charge trap layer 220 and the sacrificial insulation layer 230 may be formed on both of the first and second regions 111 and 112. In some embodiments, the substrate 110 may be a bulk wafer comprised of a single crystalline semiconductor material. For example, the substrate 110 may be a silicon wafer, a germanium wafer, a silicon-germanium wafer or a Group III-V compound semiconductor wafer. The substrate 110 may be a P-type substrate.

A trench isolation layer 120 may be disposed in an upper region of the substrate 110. The trench isolation layer 120 may be formed to include an insulation layer such as an oxide layer or a nitride layer. The trench isolation layer 120 may be formed to isolate memory cells in the substrate 110 from each other. More specifically, the trench isolation layer 120 may be formed to isolate the memory cells in the first region 111 and MOS transistors in the second region 112 from each other.

In some embodiments, the tunnel insulation layer 210 may be formed of a silicon dioxide layer, a silicon oxynitride layer or a combination thereof. The tunnel insulation layer 210 may be formed using a thermal oxidation process or a radical oxidation process. The charge trap layer 220 may be formed of a silicon nitride layer. The charge trap layer 220 may be formed using a chemical vapor deposition (CVD) process. The sacrificial insulation layer 230 may be formed of a silicon dioxide layer, a silicon oxynitride layer or a combination thereof. The sacrificial insulation layer 230 may be formed using a thermal oxidation process or a radical oxidation process.

Figure 2:
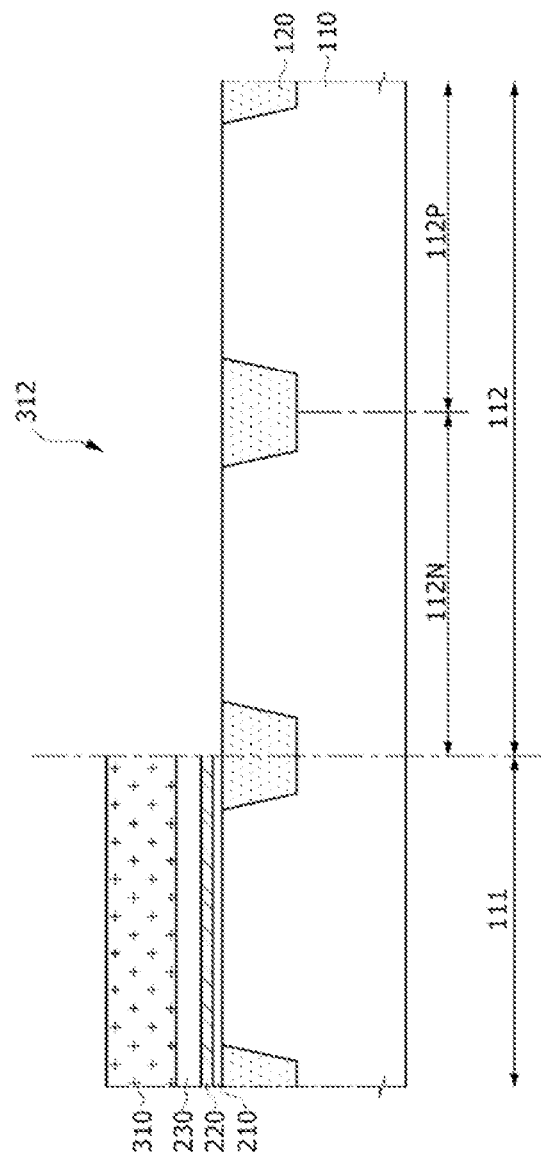

Referring to FIG. 2, a first mask pattern 310 may be formed on the sacrificial insulation layer 230. The first mask pattern 310 may be formed to have an opening 312 that selectively exposes the sacrificial insulation layer 230 on the second region 112 of the substrate 110. That is, the first mask pattern 310 may be formed to cover the sacrificial insulation layer 230 on the first region 111 of the substrate 110. In some embodiments, the first mask pattern 310 may be formed of a photoresist layer. Subsequently, the sacrificial insulation layer 230 exposed by the opening 312 may be removed to expose the charge trap layer 220 on the second region 112 of the substrate 110. The exposed charge trap layer 220 on the second region 112 of the substrate 110 may then be removed to expose the tunnel insulation layer 210 on the second region 112 of the substrate 110. The exposed tunnel insulation layer 210 on the second region 112 of the substrate 110 may be removed to expose a top surface of the second region 112 of the substrate 110. Even though the tunnel insulation layer 210 on the second region 112 of the substrate 110 is removed, a native oxide layer (not shown) may remain on the top surface of the second region 112 of the substrate 110. After removal of the sacrificial insulation layer 230, the charge trap layer 220 and the tunnel insulation layer 210 stacked on the second region 112 of the substrate 110, the first mask pattern 310 may be removed.

Figure 3:
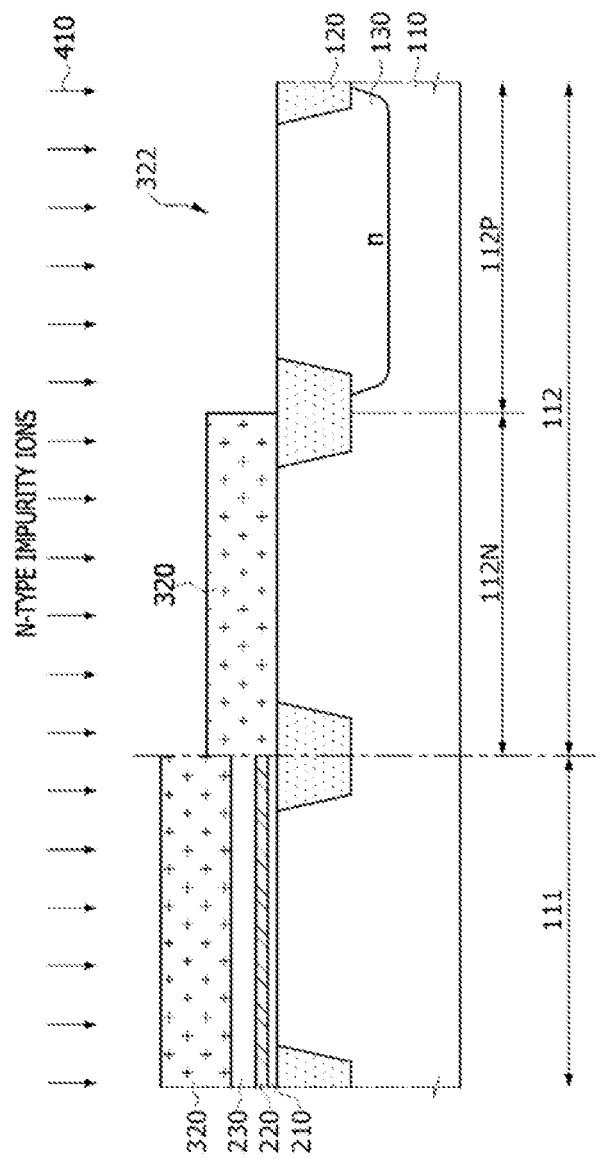

Referring to FIG. 3, a second mask pattern 320 may be formed to cover the sacrificial insulation layer 230 remaining on the first region 111 of the substrate 110 and to cover the NMOS transistor region 112N of the substrate 110. The second mask pattern 320 may be formed to have an opening 322 that selectively exposes the PMOS transistor region 112P of the substrate 110. In some embodiments, the second mask pattern 320 may be formed of a photoresist layer. Subsequently, N-type impurity ions may be implanted into the substrate 110 using the second mask pattern 320 as an ion implantation mask, as indicated by arrows 410 of FIG. 3. When the native oxide layer remains on the top surface of the substrate 110 as mentioned above, the native oxide layer acts as an ion implantation buffer layer while the N-type impurity ions are implanted into the substrate 110. As a result of the ion implantation process, a first well region 130 having N-type conductivity may be to formed in an upper region of the PMOS transistor region 112P of the substrate 110. A junction depth and an impurity concentration profile of the first well region 130 may be determined by a subsequent diffusion process corresponding to a well drive-in process. After forming the first well region 130, the second mask pattern 320 may be removed.

Figure 4:
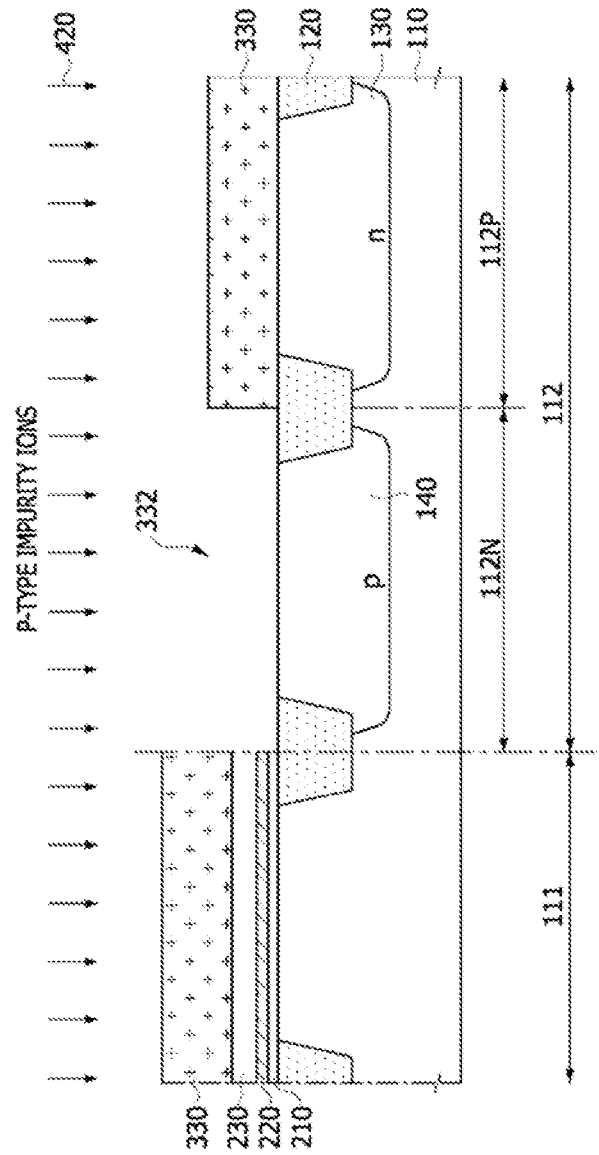

Referring to FIG. 4, a third mask pattern 330 may be formed to cover the sacrificial insulation layer 230 remaining on the first region 111 of the substrate 110 and to cover the PMOS transistor region 112P of the substrate 110. The third mask pattern 330 may be formed to have an opening 332 that selectively exposes the NMOS transistor region 112N of the substrate 110. In some embodiments, the third mask pattern 330 may be formed of a photoresist layer. Subsequently, P-type impurity ions may be implanted into the substrate 110 using the third mask pattern 330 as an ion implantation mask, as indicated by arrows 420 of FIG. 4. When the native oxide layer remains on the top surface of the substrate 110 as mentioned above, the native oxide layer acts as an ion implantation buffer layer while the P-type impurity ions are implanted into the substrate 110. As a result of the Ion implantation process, a second well region 140 having a P-type conductivity may be formed in an upper region of the NMOS transistor region 112N of the substrate 110. A junction depth and an impurity concentration profile of the second well region 140 may be determined by a subsequent diffusion process corresponding to a well drive-in process. After forming the second well region 140, the third mask pattern 330 may be removed.

Figure 5:
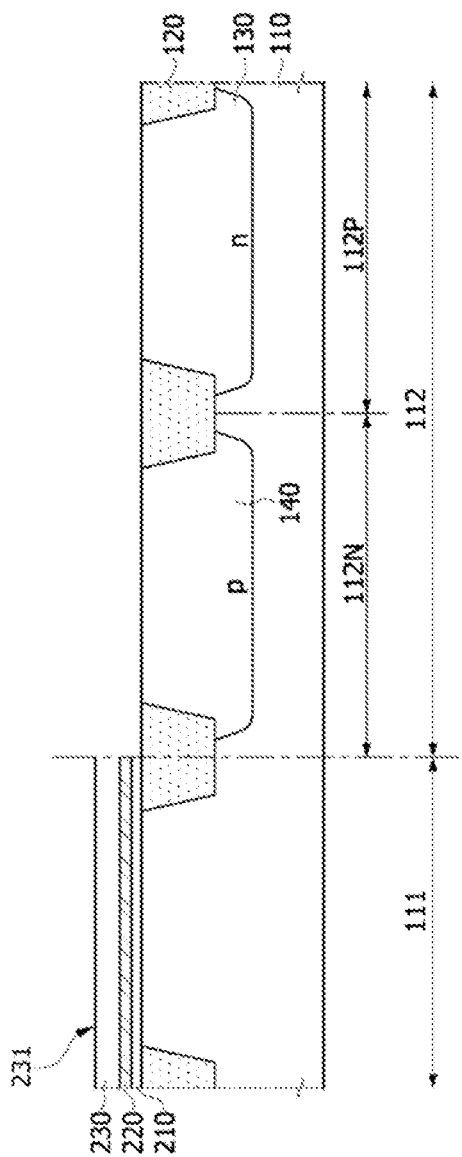

Referring to FIG. 5, after removing the third mask pattern 330 of FIG. 4, the tunnel Insulation layer 210, the charge trap layer 220 and the sacrificial insulation layer 230 may remain on the first region 111 of the substrate 110, and the first and second well regions 130 and 140 may be respectively formed in an upper region of the PMOS transistor region 112P and an upper region of the NMOS transistor region 112N. A top surface of the remaining sacrificial insulation layer 230 may be damaged while the first, second and third mask patterns 310 of FIG. 2, 320 of FIG. 3 and 330 of FIG. 4 are formed and removed, and a thickness of the remaining sacrificial insulation layer 230 may be less than an initial thickness of the sacrificial insulation layer 230. In addition, residues of the first, second and third mask patterns 310 of FIG. 2, 320 of FIG. 3 and 330 of FIG. 4 may remain on a top surface 231 of the remaining sacrificial insulation layer 230. Thus, the remaining sacrificial insulation layer 230 may be inappropriate for a blocking insulation layer of charge trap memory cells. Accordingly, the remaining sacrificial Insulation layer 230 may be removed while a native oxide layer existing on the second region 112 of the substrate 110 is removed.

Figure 6:
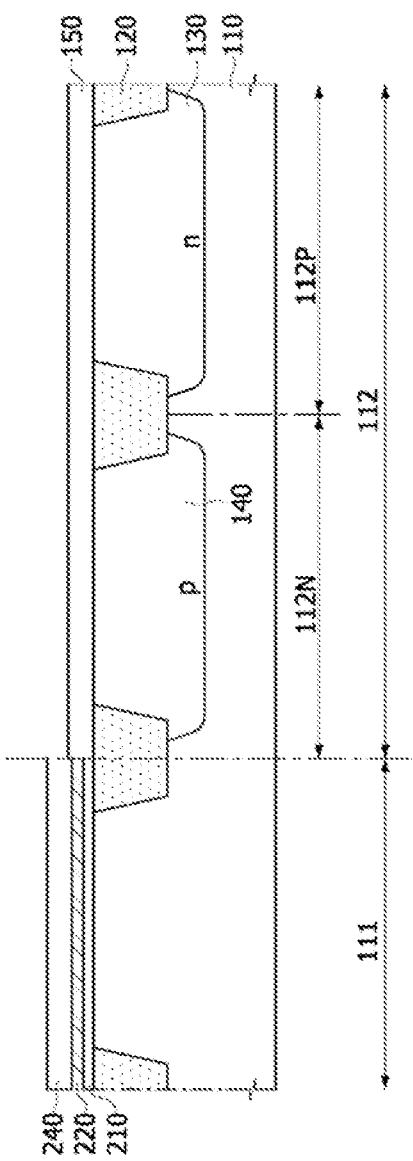

Referring to FIG. 6, after the remaining sacrificial insulation layer 230 is removed, a top surface of the remaining charge trap layer 220 may be exposed. A blocking insulation layer 240 may be formed on the remaining charge trap layer 220, and a gate insulation layer 150 may be formed on the second region 112 of the substrate 110. The blocking insulation layer 240 and the gate insulation layer 150 may be formed using a thermal oxidation process without use of any masks. For example, the blocking insulation layer 240 and the gate insulation layer 150 may be simultaneously formed using a thermal oxidation process. Thus, the blocking insulation layer 240 and the gate insulation layer 150 may be formed of substantially the same material. In some embodiments, the blocking insulation layer 240 and the gate insulation layer 150 may be formed of a silicon dioxide layer.

Figure 7:
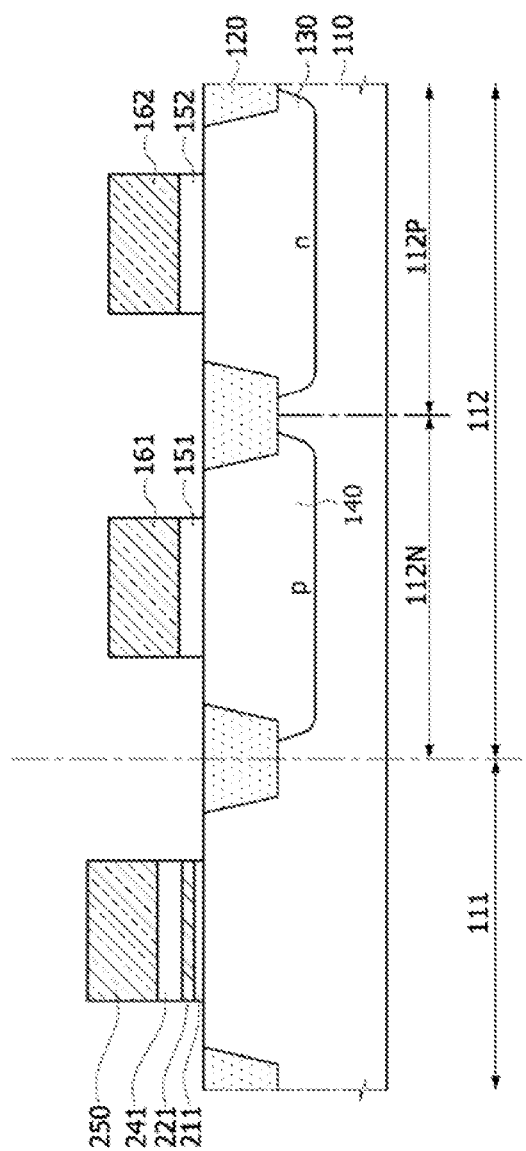

Referring to FIG. 7, a conductive layer, for example, a doped polysilicon layer may be formed on the blocking insulation layer 240 of FIG. 6 and the gate insulation layer 150 of FIG. 6. The conductive layer may be patterned to form a control gate electrode 250, a first gate electrode 161 and a second gate electrode 162. The control gate electrode 250 may be formed over the first region 111 of the substrate 110. The first gate electrode 161 and the second gate electrode 162 may be formed over the NMOS transistor region 112N and the PMOS transistor region 112P of the substrate 110, respectively.

The blocking insulation layer 240 of FIG. 6, the remaining charge trap layer 220 of FIG. 6 and the remaining tunnel insulation layer 210 of FIG. 6 may be successively etched using the control gate electrode 250 as an etch mask. As a result, a tunnel insulation pattern 211, a charge trap pattern 221, a blocking insulation pattern 241 and the control gate electrode 250, which are sequentially stacked on the first region 111 of the substrate 110, may be formed to constitute a gate stack structure of the charge trap memory cell. While the blocking insulation layer 240 of FIG. 6, the remaining charge trap layer 220 of FIG. 6 and the remaining tunnel insulation layer 210 of FIG. 6 are successively etched, the gate insulation layer 150 of FIG. 6 may also be etched using the first and second gate electrodes 161 and 162 as etch masks. As a result, a first gate insulation layer 151 and the first gate electrode 161, which are sequentially stacked on the NMOS transistor region 112N of the substrate 110, may be formed to constitute a gate stack of an NMOS transistor. Similarly, a second gate insulation layer 152 and the second gate electrode 162, which are sequentially stacked on the PMOS transistor region 112P of the substrate 110, may be formed to constitute a gate stack of a PMOS transistor.

In some other embodiments, the etch process for patterning the gate insulation layer 150 of FIG. 6 may be performed after or before the etch process for patterning the blocking insulation layer 240 of FIG. 6, the remaining charge trap layer 220 of FIG. 6 and the remaining tunnel insulation layer 210 of FIG. 6.

Figure 8:
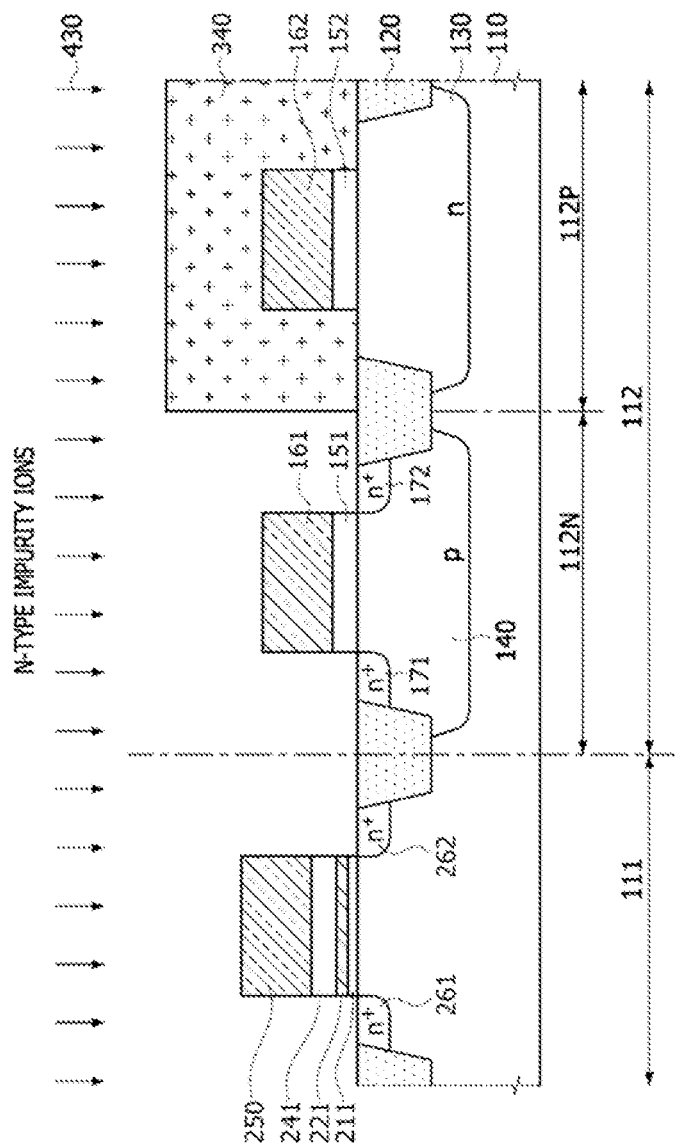

Referring to FIG. 8, a fourth mask pattern 340 may be formed on the PMOS transistor region 112P of the substrate 110 to cover the second gate electrode 162. In some embodiments, the fourth mask pattern 340 may be formed of a photoresist layer.

Subsequently, N-type impurity ions may be implanted into the substrate 110 using the fourth mask pattern 340 as an ion implantation mask, as indicated by the arrows 430 of FIG. 8. As a result of the ion implantation process, an N-type source region 261 and an N-type drain region 262 of the charge trap memory cell may be formed in an upper region of the first region 111 of the substrate 110, and an N-type source region 171 and an N-type drain region 172 of the NMOS transistor may be formed in an upper region of the NMOS transistor region 112N, i.e., the second well region 140 of the substrate 110. After the ion implantation process for forming the N-type source/drain regions 261, 262, 171 and 172, the fourth mask pattern 340 may be removed.

Figure 9:
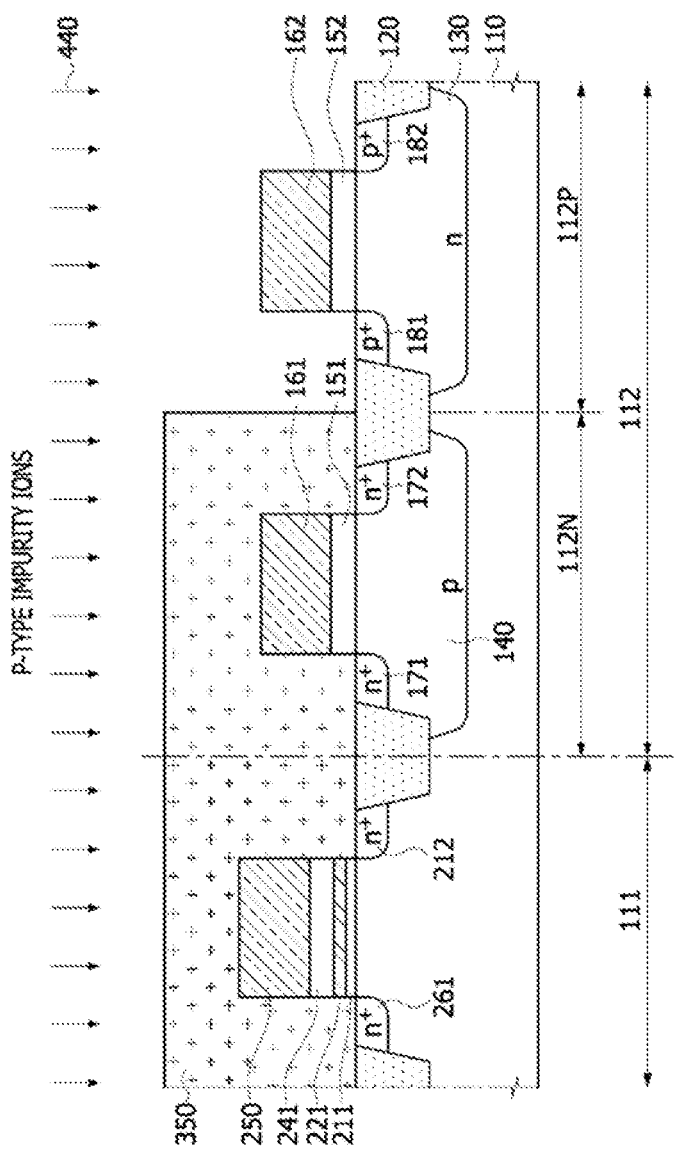

Referring to FIG. 9, a fifth mask pattern 350 may be formed on the first region 111 and the NMOS transistor region 112N of the substrate 110 to cover the control gate electrode 250 and the first gate electrode 161. In some embodiments, the fifth mask pattern 350 may be formed of a photoresist layer.

Subsequently, P-type impurity ions may be implanted into the substrate 110 using the fifth mask pattern 350 as an ion implantation mask, as indicated by arrows 440 of FIG. 9. As a result of the ion implantation process, a P-type source region 181 and a P-type drain region 182 of the PMOS transistor may be formed in an upper region of the PMOS transistor region 112P, i.e., the first well region 130 of the substrate 110. After the ion implantation process for forming the P-type source/drain regions 181 and 182, the fifth mask pattern 350 may be removed.

FIGS. 10 to 18 are cross-sectional views illustrating a method of fabricating an embedded electronic device including charge trap memory cells according to another embodiment. In FIGS. 10 to 18, the same reference numerals as used in FIGS. 1 to 9 denote the same elements.

Figure 10:
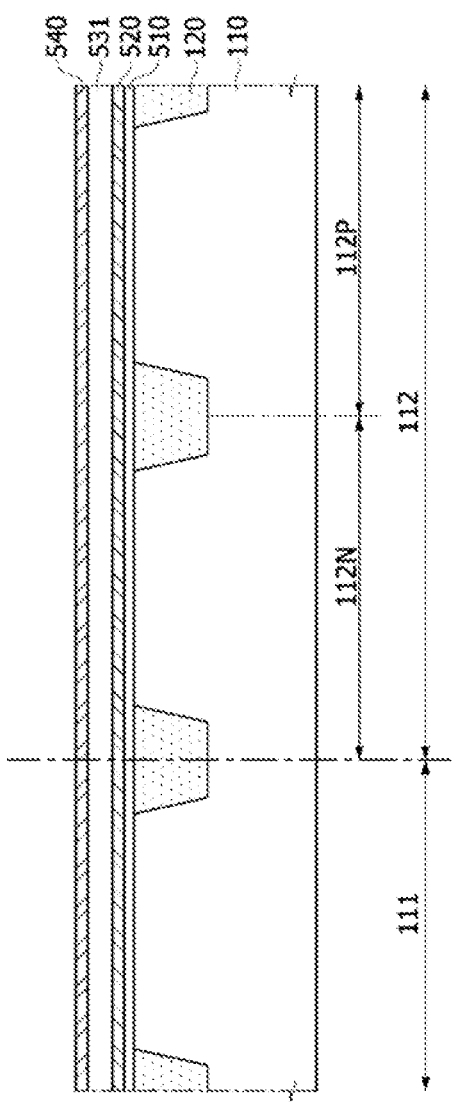
FIGS. 10 to 18 are cross-sectional views illustrating a method of fabricating an embedded electronic device including charge trap memory cells according to another embodiment.

Referring to FIG. 10, a tunnel insulation layer 510, a charge trap layer 520, a first blocking insulation layer 531 and a protection layer 540 may be sequentially formed on the substrate 110 having the first region 111 and the second region 112. The first region 111 may correspond to a region on which an NVM cell such as the charge trap memory cell is disposed. The second region 112 may correspond to a region on which logic devices comprised of MOS transistors are disposed. The second region 112 may include the NMOS transistor region 112N on which an NMOS transistor is formed and the PMOS transistor region 112P on which a PMOS transistor is formed. Each of the tunnel insulation layer 510, the charge trap layer 520, the first blocking insulation layer 531 and the protection layer 540 may be formed on both of the first and second regions 111 and 112. In some embodiments, the substrate 110 may be a bulk wafer comprised of a single crystalline semiconductor material. For example, the substrate 110 may be a silicon wafer, a germanium wafer, a silicon-germanium wafer or a Group III-V compound semiconductor wafer. The substrate 110 may be a P-type substrate.

The trench isolation layer 120 may be disposed in an upper region of the substrate 110. The trench isolation layer 120 may include an insulation layer such as an oxide layer or a nitride layer. The trench isolation layer 120 may isolate memory cells in the substrate 110 from each other. More specifically, the trench isolation layer 120 may isolate the memory cells in the first region 111 and MOS transistors in the second region 112 from each other.

In some embodiments, the tunnel insulation layer 510 may be formed of a silicon dioxide layer, a silicon oxynitride layer or a combination thereof. The tunnel insulation layer 510 may be formed using a thermal oxidation process or a radical oxidation process. The charge trap layer 520 may be formed of a silicon nitride layer. The charge trap layer 520 may be formed using a chemical vapor deposition (CVD) process. The first blocking insulation layer 531 may be formed of a silicon dioxide layer.

In some embodiments, the first blocking insulation layer 531 may be formed using a thermal oxidation process or a radical oxidation process. The protection layer 540 may be formed of a silicon nitride layer. In some embodiments, the protection layer 540 may be formed using a chemical vapor deposition (CVD) process.

Figure 11:
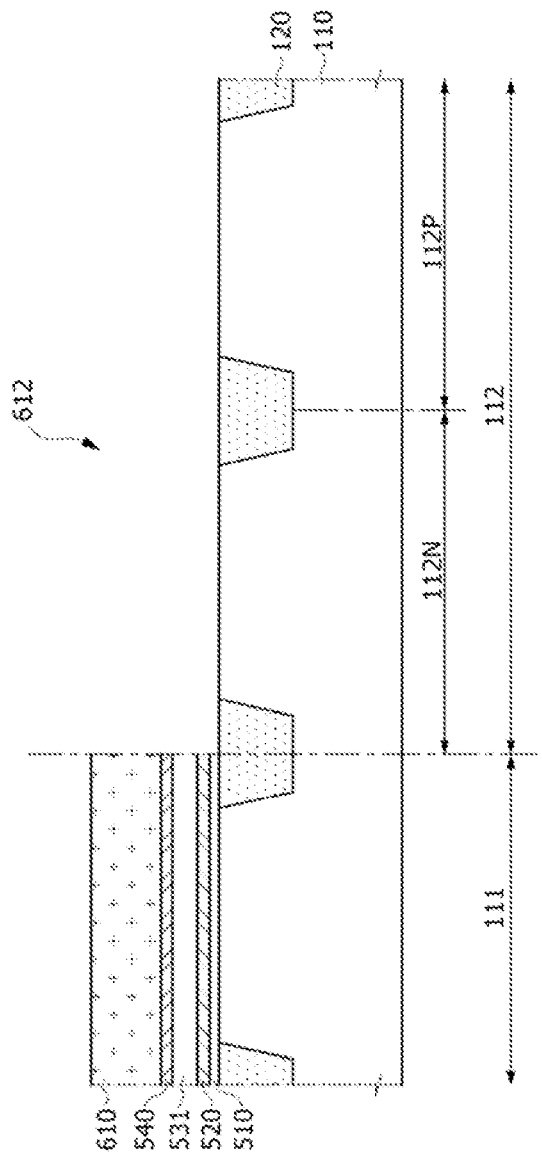

Referring to FIG. 11, a first mask pattern 610 may be formed on the protection layer 540. The first mask pattern 610 may be formed to have an opening 612 that selectively exposes the protection layer 540 on the second region 112 of the substrate 110. That is, the first mask pattern 610 may be formed to cover the protection layer 540 on the first region 111 of the substrate 110. In some embodiments, the first mask pattern 610 may be formed of a photoresist layer. Subsequently, the protection layer 540 exposed by the opening 612 may be removed to expose the first blocking insulation layer 531 on the second region 112 of the substrate 110. The exposed first blocking insulation layer 531 on the second region 112 of the substrate 110 may then be removed to expose the charge trap layer 520 on the second region 112 of the substrate 110. The exposed charge trap layer 520 on the second region 112 of the substrate 110 may be removed to expose the tunnel insulation layer 510 on the second region 112 of the substrate 110. The exposed tunnel insulation layer 510 on the second region 112 of the substrate 110 may be removed to expose a top surface of the second region 112 of the substrate 110. Even though the tunnel insulation layer 510 on the second region 112 of the substrate 110 is removed, a native oxide layer (not shown) may remain on the top surface of the second region 112 of the substrate 110. After removal of the protection layer 540, the first blocking insulation layer 531, the charge trap layer 220 and the tunnel insulation layer 210 stacked on the second region 112 of the substrate 110, the first mask pattern 610 may be removed.

Figure 12:
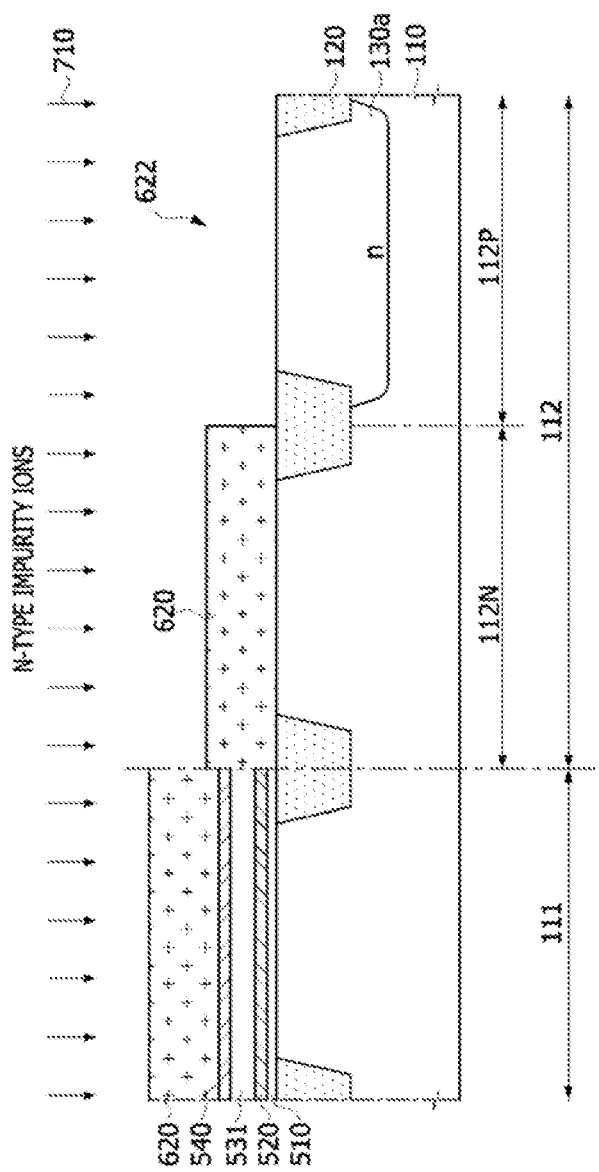

Referring to FIG. 12, a second mask pattern 620 may be formed to cover the protection layer 540 remaining on the first region 111 of the substrate 110 and to cover the NMOS transistor region 112N of the substrate 110. The second mask pattern 620 may be formed to have an opening 622 that selectively exposes the PMOS transistor region 112P of the substrate 110. In some embodiments, the second mask pattern 620 may be formed of a photoresist layer. Subsequently, N-type impurity ions may be implanted into the substrate 110 using the second mask pattern 620 as an ion implantation mask, as indicated by arrows 710 of FIG. 12. When the native oxide layer remains on the top surface of the substrate 110 as mentioned above, the native oxide layer may acts as an ion Implantation buffer layer while the N-type impurity ions are implanted into the substrate 110. As a result of the ion implantation process, a first well region 130a having a N-type conductivity may be formed in an upper region of the PMOS transistor region 112P of the substrate 110. A junction depth and an impurity concentra-tion profile of the first well region 130a may be determined by a subsequent diffusion process corresponding to a well drive-in process. After forming the first well region 130a, the second mask pattern 620 may be removed.

Figure 13:
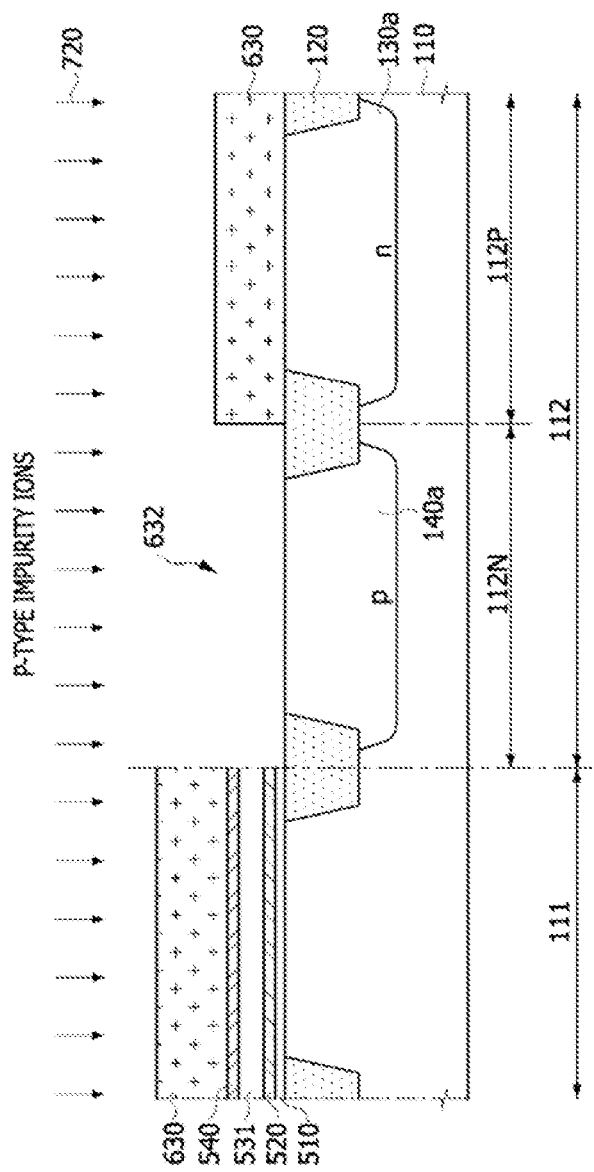

Referring to FIG. 13, a third mask pattern 630 may be formed to cover the protection layer 230 remaining on the first region 111 of the substrate 110 and to cover the PMOS transistor region 112P of the substrate 110. The third mask pattern 630 may be formed to have an opening 632 that selectively exposes the NMOS transistor region 112N of the substrate 110. In some embodiments, the third mask pattern 630 may be formed of a photoresist layer. Subsequently, P-type impurity ions may be implanted into the substrate 110 using the third mask pattern 630 as an ion implantation mask, as Indicated by arrows 720 of FIG. 13. When the native oxide layer remains on the top surface of the substrate 110 as mentioned above, the native oxide layer acts as an ion implantation buffer layer while the P-type impurity ions are implanted into the substrate 110. As a result of the ion implantation process, a second well region 140a having a P-type conductivity may be formed in an upper region of the NMOS transistor region 112N of the substrate 110. A junction depth and an impurity concentration profile of the second well region 140a may be determined by a subsequent diffusion process corresponding to a well drive-in process. After forming the second well region 140a, the third mask pattern 630 may be removed.

Figure 14:
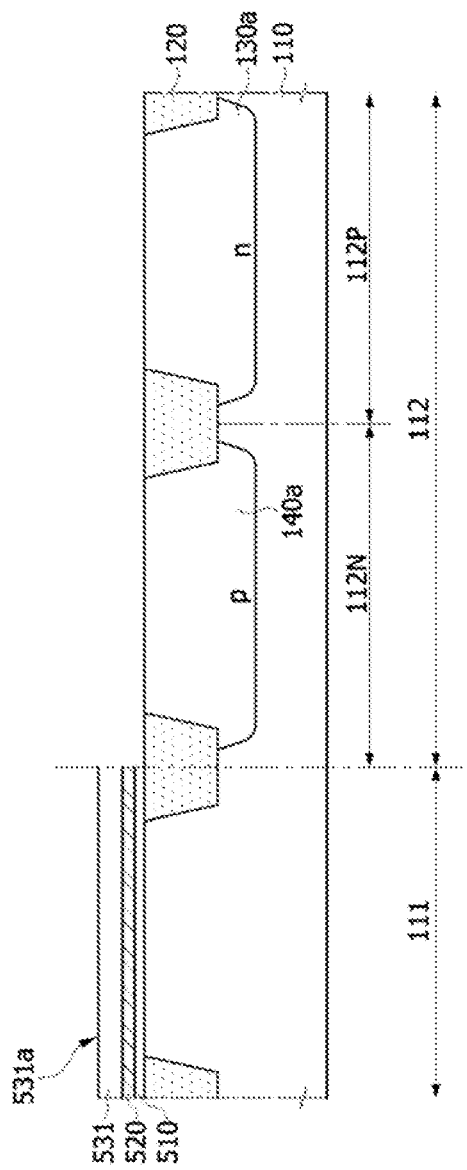

Referring to FIG. 14, after removing the third mask pattern 630 of FIG. 13, the protection layer 540 of FIG. 13 remaining on the first region 111 of the substrate 110 may be removed to expose a top surface 531a of the first blocking insulation layer 531 remaining on the first region 111 of the substrate 110. The protection layer 540 of FIGS. 10 to 13 may protect the top surface 531a of the first blocking insulation layer 531 from being damaged while the first, second and third mask patterns 610 of FIG. 11, 620 of FIG. 12, and 630 of FIG. 13 are formed and removed. Thus, a thickness of the first blocking insulation layer 531 remaining on the first region 111 of the substrate 110 may be substan-tially equal to an initial thickness of the first blocking insulation layer 531. In addition, residues generated from the first, second and third mask patterns 610, 620 and 630 may be removed while the protection layer 540 is removed. Accordingly, no photoresist residues may remain on the top surface 531a of the first blocking insulation layer 531 remaining on the first region 111 of the substrate 110.

Figure 15:
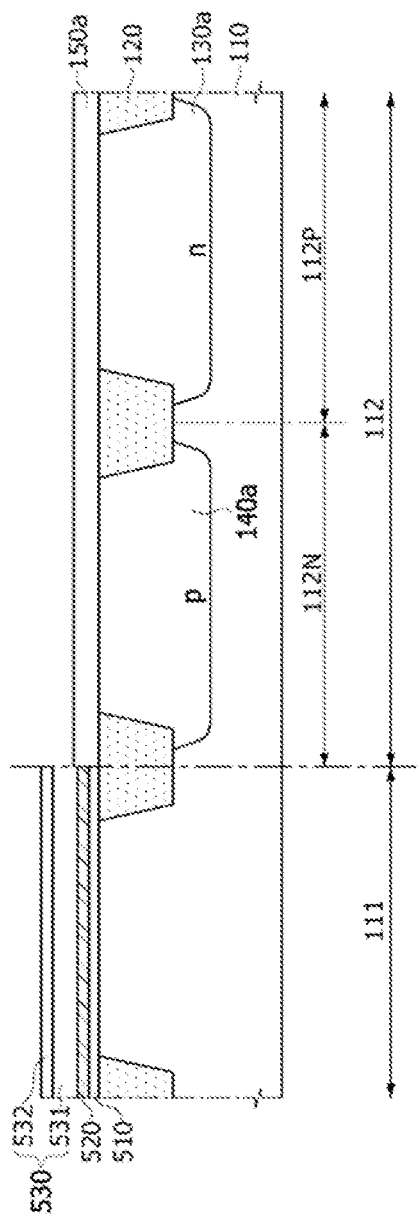

Referring to FIG. 15, after the protection layer 540 remaining on the first region 111 of the substrate 110 is removed, a second blocking insulation layer 532 and a gate insulation layer 150a may be respectively formed on the remaining first blocking insulation layer 531 and the second region 112 of the substrate 110. The second blocking insu-lation layer 532 and the gate insulation layer 150a may be formed using a thermal oxidation process without use of any masks. For example, the second blocking insulation layer 532 and the gate insulation layer 150a may be simultane-ously formed using a thermal oxidation process. Thus, the second blocking insulation layer 532 and the gate insulation layer 150a may be formed of substantially the same mate-rial. The first blocking insulation layer 531 and the second blocking insulation layer 532 may constitute a blocking insulation layer 530 of the charge trap memory cell.

According to the present embodiment, even though the second blocking insulation layer 532 and the gate insulation layer 150a are thinly formed to improve characteristics of MOS transistors which are formed on the second region 112 of the substrate 110 in subsequent processes, the blocking insulation layer 530 may have a sufficient thickness to obtain for the charge trap memory cell to perform well because the first blocking insulation layer 531 has an appropriate thickness. In some embodiments, the second blocking insulation layer 532 and the gate insulation layer 150a may be formed of a silicon dioxide layer.

Figure 16:
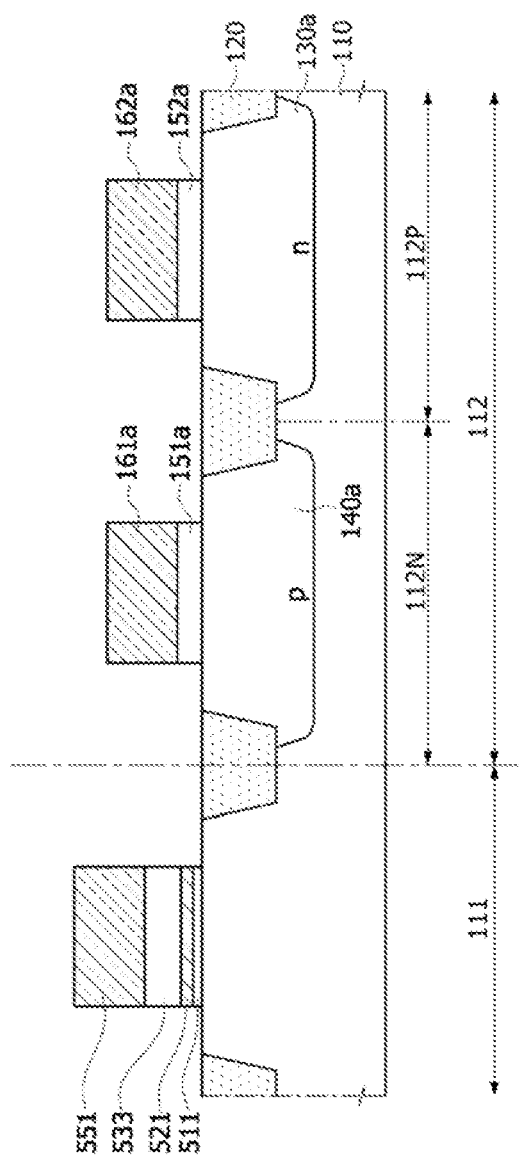

Referring to FIG. 16, a conductive layer, for example, a doped polysilicon layer may be formed on the blocking insulation layer 530 of FIG. 15 and the gate insulation layer 150a of FIG. 15. The conductive layer may be patterned to form a control gate electrode 551, a first gate electrode 161a and a second gate electrode 162a. The control gate electrode 551 may be formed over the first region 111 of the substrate 110. The first gate electrode 161a and the second gate electrode 162a may be formed over the NMOS transistor region 112N and the PMOS transistor region 112P of the substrate 110, respectively.

The blocking insulation layer 530 of FIG. 15, the remaining charge trap layer 520 of FIG. 15 and the remaining tunnel insulation layer 510 of FIG. 15 may be successively etched using the control gate electrode 551 as an etch mask. As a result, a tunnel insulation pattern 511, a charge trap pattern 521, a blocking insulation pattern 533 and the control gate electrode 551, which are sequentially stacked on the first region 111 of the substrate 110, may be formed to constitute a gate stack structure of the charge trap memory cell. While the blocking insulation layer 530 of FIG. 15, the remaining charge trap layer 520 of FIG. 15 and the remaining tunnel insulation layer 510 of FIG. 15 are successively etched, the gate insulation layer 150a of FIG. 15 may also be etched using the first and second gate electrodes 161a and 162a as etch masks. Alternatively, the etch process for patterning the gate insulation layer 150a of FIG. 15 may be performed after or before the etch process for patterning the blocking insulation layer 530 of FIG. 15, the remaining charge trap layer 520 of FIG. 15 and the remaining tunnel insulation layer 510 of FIG. 15. In any event, a first gate insulation layer 151a and the first gate electrode 161a, which are sequentially stacked on the NMOS transistor region 112N of the substrate 110, may be formed to constitute a gate stack of an NMOS transistor. Similarly, a second gate insulation layer 152a and the second gate electrode 162a, which are sequentially stacked on the PMOS transistor region 112P of the substrate 110, may be formed to constitute a gate stack of a PMOS transistor.

Figure 17:
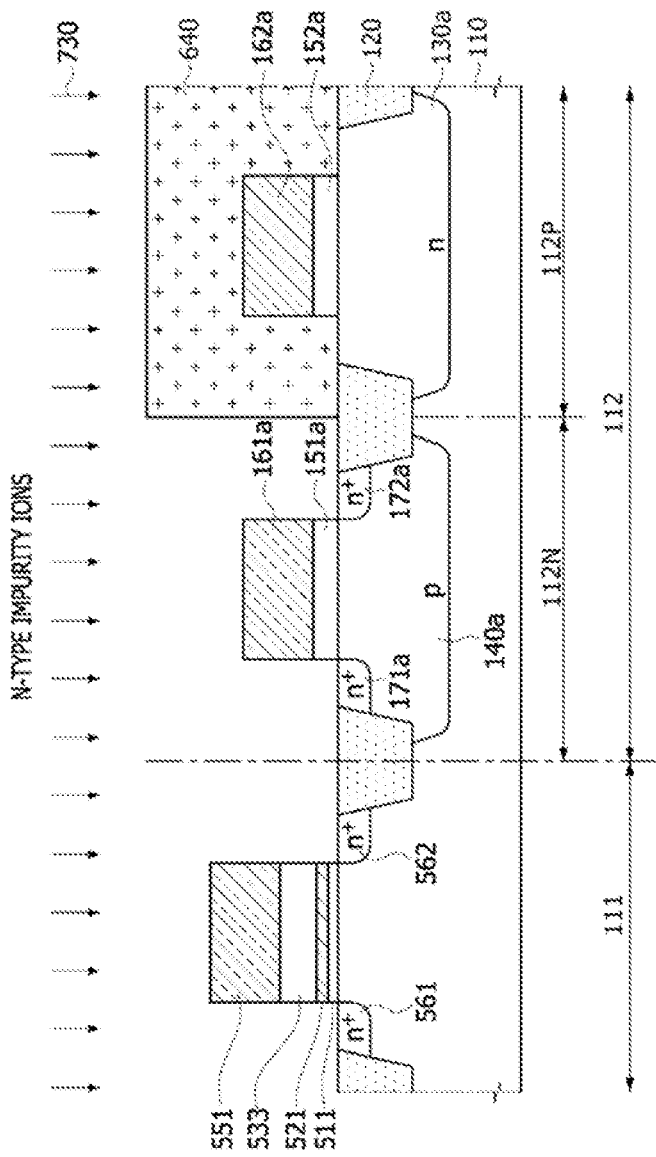

Referring to FIG. 17, a fourth mask pattern 640 may be formed on the PMOS transistor region 112P of the substrate 110 to cover the second gate electrode 162a. In some embodiments, the fourth mask pattern 640 may be formed of a photoresist layer.

Subsequently, N-type impurity ions may be implanted into the substrate 110 using the fourth mask pattern 640 as an ion implantation mask, as indicated by the arrows 730 of FIG. 17. As a result of the ion implantation process, an N-type source region 561 and an N-type drain region 562 of the charge trap memory cell may be formed in an upper region of the first region 111 of the substrate 110, and an N-type source region 171a and an N-type drain region 172a of the NMOS transistor may be formed in an upper region of the NMOS transistor region 112N, i.e., the second well region 140a of the substrate 110. After the ion implantation process for forming the N-type source/drain regions 561, 562, 171a and 172a, the fourth mask pattern 640 may be removed.

Figure 18:
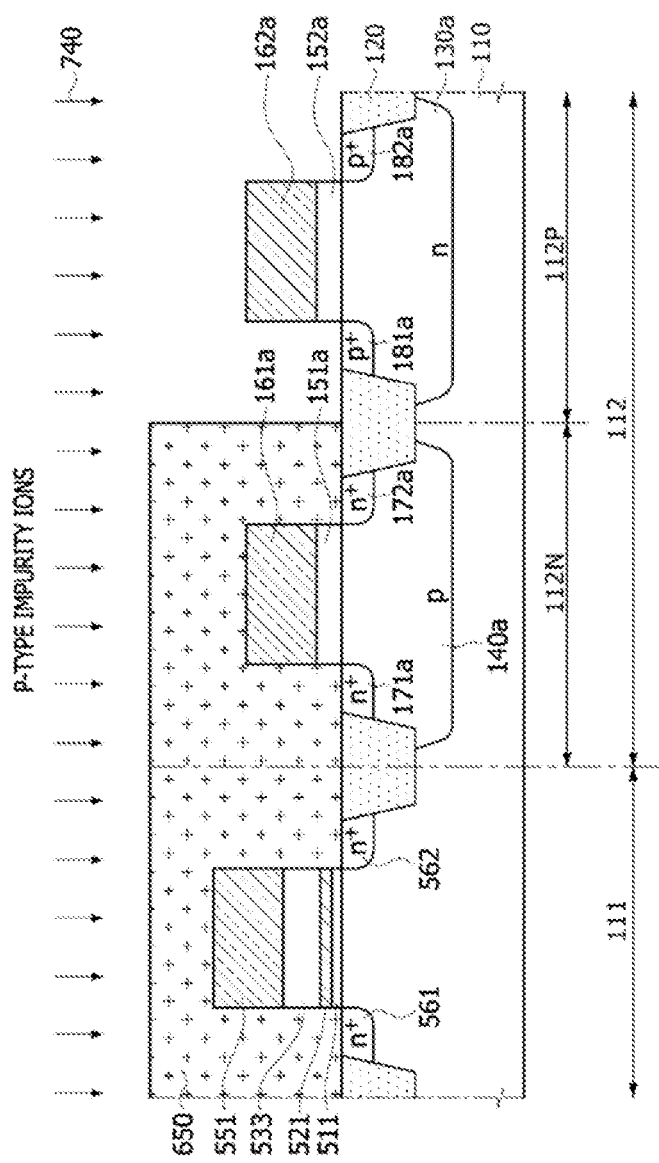

Referring to FIG. 18, a fifth mask pattern 650 may be formed on the first region 111 and the NMOS transistor region 112N of the substrate 110 to cover the control gate electrode 551 and the first gate electrode 161a. In some embodiments, the fifth mask pattern 650 may be formed of a photoresist layer.

Subsequently, P-type impurity ions may be implanted into the substrate 110 using the fifth mask pattern 650 as an ion implantation mask, as indicated by the arrows 740 of FIG. 18. As a result of the ion implantation process, a P-type source region 181a and a P-type drain region 182a of the PMOS transistor may be formed in an upper region of the PMOS transistor region 112P, i.e., the first well region 130a of the substrate 110. After the ion implantation process for forming the P-type source/drain regions 181a and 182a, the fifth mask pattern 650 may be removed.

FIGS. 19 to 26 are cross-sectional views illustrating a method of fabricating an embedded electronic device including charge trap memory cells according to still another embodiment. In FIGS. 19 to 26, the same reference numerals as used in FIGS. 1 to 9 denote the same elements.

Figure 19:
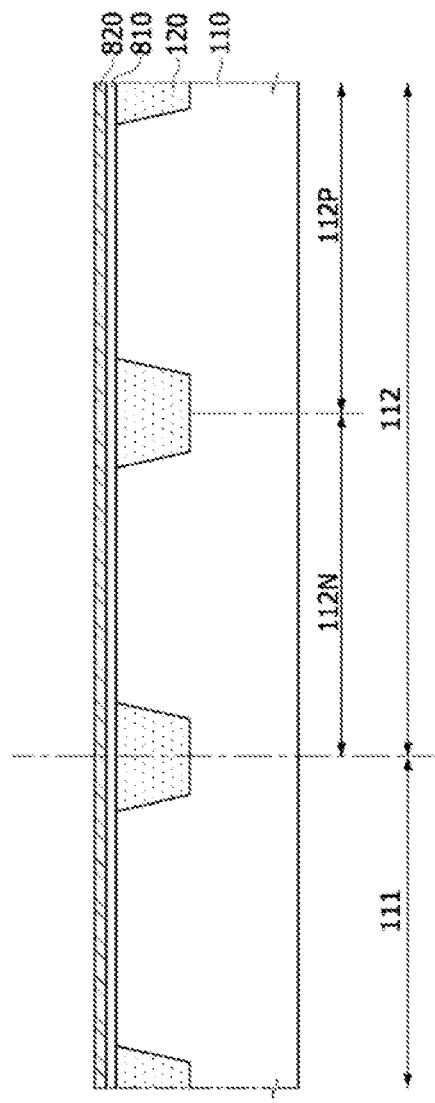

Referring to FIG. 19, a tunnel insulation layer 810 and a charge trap layer 820 may be sequentially formed on the substrate 110 having the first region 111 and the second region 112. The first region 111 may correspond to a region on which an NVM cell such as the charge trap memory cell is disposed. The second region 112 may correspond to a region on which logic devices comprised of MOS transistors are disposed. The second region 112 may include the NMOS transistor region 112N on which an NMOS transistor is formed and the PMOS transistor region 112P on which a PMOS transistor is formed. Each of the tunnel Insulation layer 810 and the charge trap layer 820 may be formed on both of the first and second regions 111 and 112. In some embodiments, the substrate 110 may be a bulk wafer comprised of a single crystalline semiconductor material. For example, the substrate 110 may be a silicon wafer, a germanium wafer, a silicon-germanium wafer or a Group III-V compound semiconductor wafer. The substrate 110 may be a P-type substrate.

The trench isolation layer 120 may be disposed in an upper region of the substrate 110. The trench isolation layer 120 may be formed to include an insulation layer such as an oxide layer or a nitride layer. The trench isolation layer 120 may be formed to isolate memory cells in the substrate 110 from each other. More specifically, the trench isolation layer 120 may be formed to isolate the memory cells in the first region 111 and MOS transistors in the second region 112 from each other.

In some embodiments, the tunnel insulation layer 810 may be formed of a silicon dioxide layer, a silicon oxynitride layer or a combination thereof. The tunnel insulation layer 810 may be formed using a thermal oxidation process or a radical oxidation process. The charge trap layer 820 may be formed of a silicon nitride layer. The charge trap layer 820 may be formed using a chemical vapor deposition (CVD) process.

Figure 20:
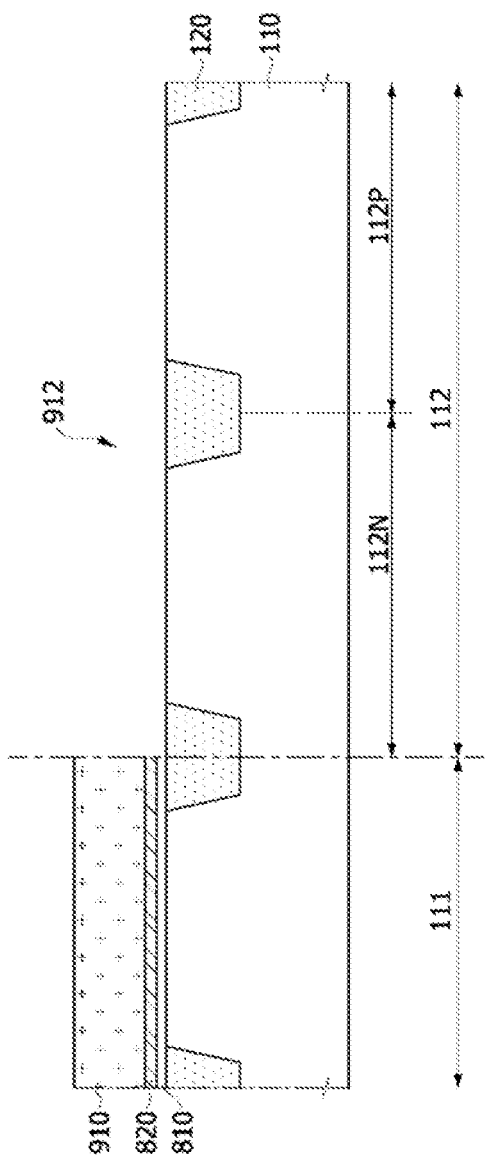

Referring to FIG. 20, a first mask pattern 910 may be formed on the charge trap layer 820. The first mask pattern 910 may be formed to have an opening 912 that selectively exposes the charge trap layer 820 on the second region 112 of the substrate 110. That is, the first mask pattern 910 may be formed to cover the charge trap layer 820 on the first region 111 of the substrate 110. In some embodiments, the first mask pattern 910 may be formed of a photoresist layer. Subsequently, the charge trap layer 820 exposed by the opening 912 may be removed to expose the tunnel insulation layer 810 on the second region 112 of the substrate 110. The exposed tunnel insulation layer 810 on the second region 112 of the substrate 110 may then be removed to expose a top surface of the second region 112 of the substrate 110. Even though the tunnel Insulation layer 810 on the second region 112 of the substrate 110 is removed, a native oxide layer (not shown) may remain on the top surface of the second region 112 of the substrate 110. After removal of the charge trap layer 820 and the tunnel insulation layer 810 stacked on the second region 112 of the substrate 110, the first mask pattern 910 may be removed.

Figure 21:
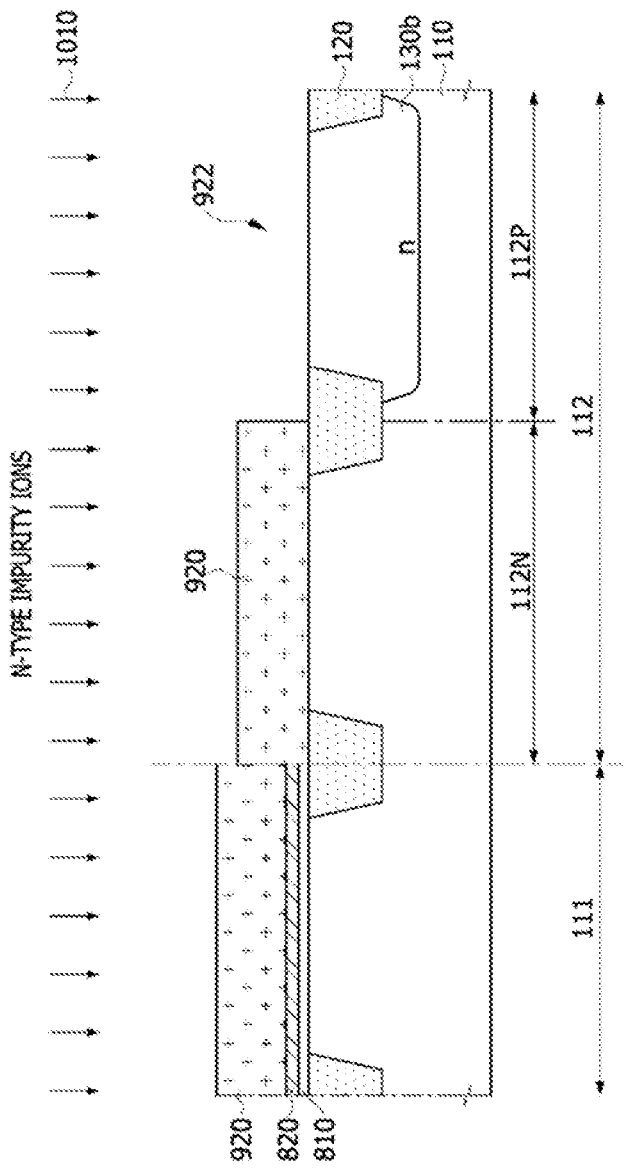

Referring to FIG. 21, a second mask pattern 920 may be formed to cover the charge trap layer 820 remaining on the first region 111 of the substrate 110 and to cover the NMOS transistor region 112N of the substrate 110. The second mask pattern 920 may be formed to have an opening 922 that selectively exposes the PMOS transistor region 112P of the substrate 110. In some embodiments, the second mask pattern 920 may be formed of a photoresist layer. Subsequently, N-type impurity ions may be implanted into the substrate 110 using the second mask pattern 920 as an ion implantation mask, as indicated by the arrows 1010 of FIG. 21. When the native oxide layer remains on the top surface of the substrate 110 as mentioned above, the native oxide layer may act as an ion implantation buffer layer while the N-type impurity ions are implanted into the substrate 110. As a result of the ion implantation process, a first well region 130b having an N-type conductivity may be formed in an upper region of the PMOS transistor region 112P of the substrate 110. A junction depth and an impurity concentration profile of the first well region 130b may be determined by a subsequent diffusion process corresponding to a well drive-in process. After forming the first well region 130b, the second mask pattern 920 may be removed.

Figure 22:
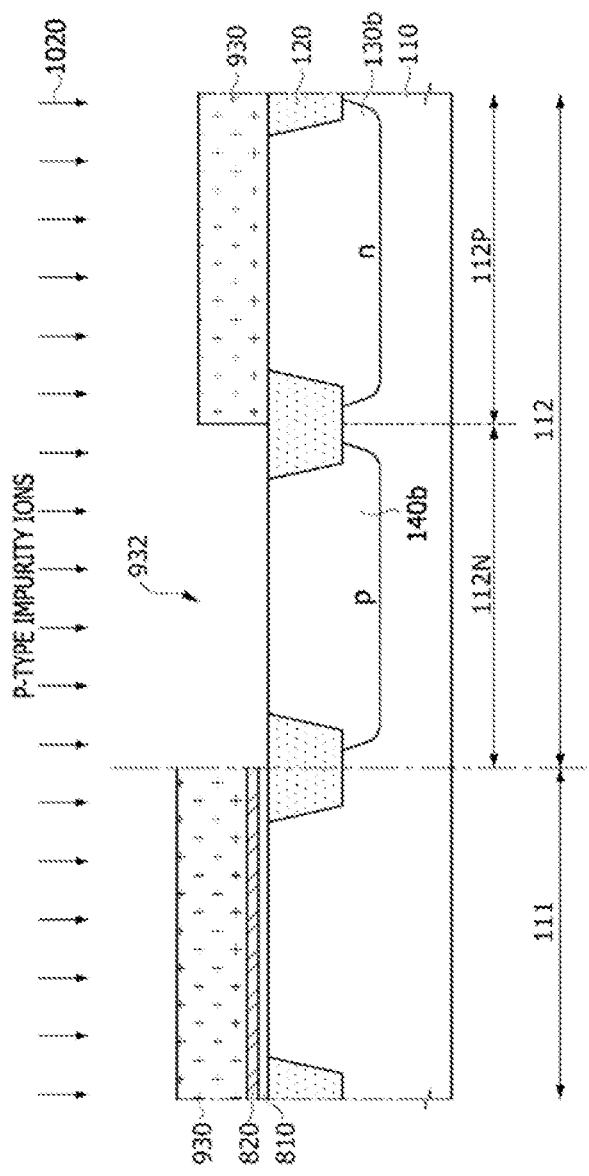

Referring to FIG. 22, a third mask pattern 930 may be formed to cover the charge trap layer 820 remaining on the first region 111 of the substrate 110 and to cover the PMOS transistor region 112P of the substrate 110. The third mask pattern 930 may be formed to have an opening 932 that selectively exposes the NMOS transistor region 112N of the substrate 110. In some embodiments, the third mask pattern 930 may be formed of a photoresist layer. Subsequently, P-type impurity ions may be implanted into the substrate 110 using the third mask pattern 930 as an ion Implantation mask, as Indicated by the arrows 1020 of FIG. 22. When the native oxide layer remains on the top surface of the substrate 110 as mentioned above, the native oxide layer acts as an ion implantation buffer layer while the P-type impurity ions are implanted into the substrate 110. As a result of the ion implantation process, a second well region 140b having a P-type conductivity may be formed in an upper region of the NMOS transistor region 112N of the substrate 110. A junction depth and an impurity concentration profile of the second well region 140b may be determined by a subsequent diffusion process corresponding to a well drive-in process. After forming the second well region 140b, the third mask pattern 930 may be removed.

Figure 23:
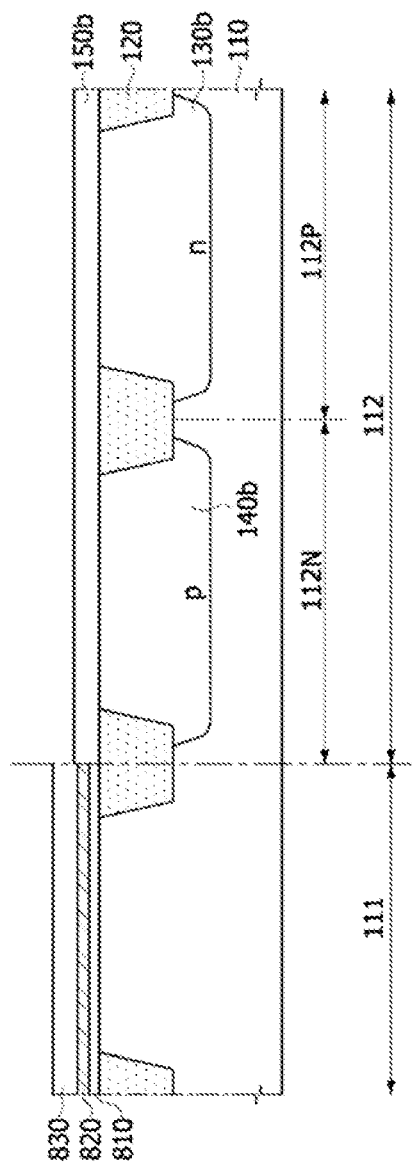

Referring to FIG. 23, after removing the third mask pattern 930 of FIG. 22, a blocking insulation layer 830 and a gate insulation layer 150b may be respectively formed on the remaining charge trap layer 820 and the second region 112 of the substrate 110. According to the present embodiment, the blocking insulation layer 830 may be formed after all of the first, second and third mask patterns 910 of FIG. 20, 920 of FIG. 21 and 930 of FIG. 22 are removed. Thus, the blocking insulation layer 830 may not be damaged by formation and removal of the first, second and third mask patterns 910 of FIG. 20, 920 of FIG. 21 and 930 of FIG. 22.

Accordingly, a thickness of the blocking insulation layer 830 may not be changed by formation and removal of the first, second and third mask patterns 910 of FIG. 20, 920 of FIG. 21 and 930 of FIG. 22. In addition, the blocking insulation layer 830 may not be contaminated by residues which are generated from the first, second and third mask patterns 910 of FIG. 20, 920 of FIG. 21 and 930 of FIG. 22. The blocking insulation layer 830 and the gate insulation layer 150b may be formed using a thermal oxidation process without use of any masks. For example, the blocking insulation layer 830 and the gate insulation layer 150b may be simultaneously formed using a thermal oxidation process. Thus, the blocking insulation layer 830 and the gate insulation layer 150b may be formed of substantially the same material. In some embodiments, the blocking insulation layer 830 and the gate insulation layer 150b may be formed of a silicon dioxide layer.

Figure 24:
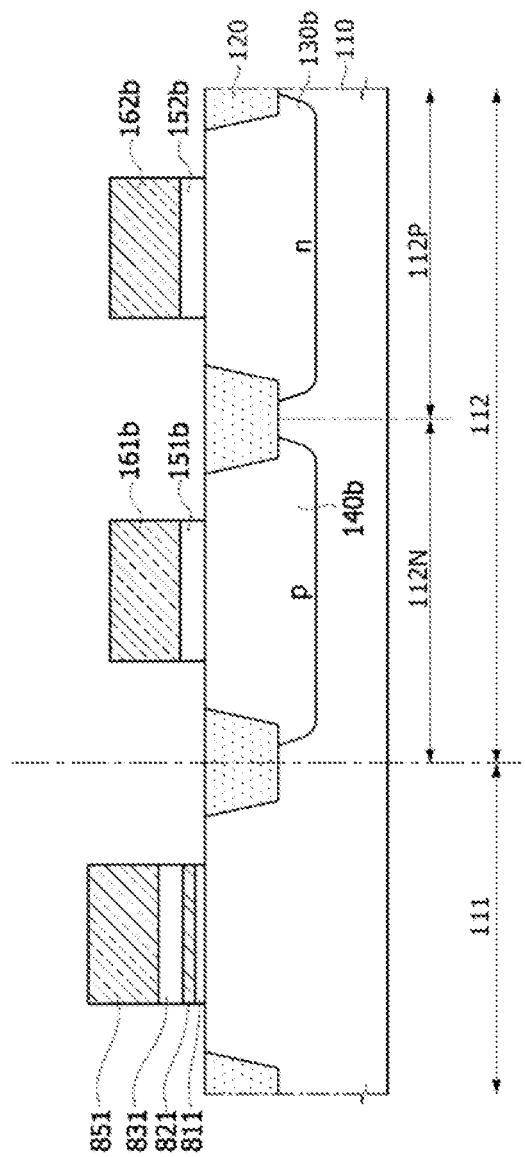

Referring to FIG. 24, a conductive layer, for example, a doped polysilicon layer may be formed on the blocking insulation layer 830 of FIG. 23 and the gate insulation layer 150b of FIG. 23. The conductive layer may then be patterned to form a control gate electrode 851, a first gate electrode 161b and a second gate electrode 162b. The control gate electrode 851 may be formed over the first region 111 of the substrate 110. The first gate electrode 161b and the second gate electrode 162b may be formed over the NMOS transistor region 112N and the PMOS transistor region 112P of the substrate 110, respectively.

The blocking insulation layer 830 of FIG. 23, the remaining charge trap layer 820 of FIG. 23 and the remaining tunnel Insulation layer 810 of FIG. 23 may be successively etched using the control gate electrode 851 as an etch mask. As a result, a tunnel insulation pattern 811, a charge trap pattern 821, a blocking insulation pattern 831 and the control gate electrode 851, which are sequentially stacked on the first region 111 of the substrate 110, may be formed to constitute a gate stack structure of the charge trap memory cell. While the blocking insulation layer 830 of FIG. 23, the remaining charge trap layer 820 of FIG. 23 and the remaining tunnel Insulation layer 810 of FIG. 23 are successively etched, the gate insulation layer 150b of FIG. 23 may also be etched using the first and second gate electrodes 161b and 162b as etch masks. Alternatively, the etch process for patterning the gate insulation layer 150b of FIG. 23 may be performed after or before the etch process for patterning the blocking insulation layer 830 of FIG. 23, the remaining charge trap layer 820 of FIG. 23 and the remaining tunnel insulation layer 810 of FIG. 23. In any event, a first gate insulation layer 151b and the first gate electrode 161b, which are sequentially stacked on the NMOS transistor region 112N of the substrate 110, may be formed to constitute a gate stack of an NMOS transistor. Similarly, a second gate insulation layer 152b and the second gate electrode 162b, which are sequentially stacked on the PMOS transistor region 112P of the substrate 110, may be formed to constitute a gate stack of a PMOS transistor.

Figure 25:
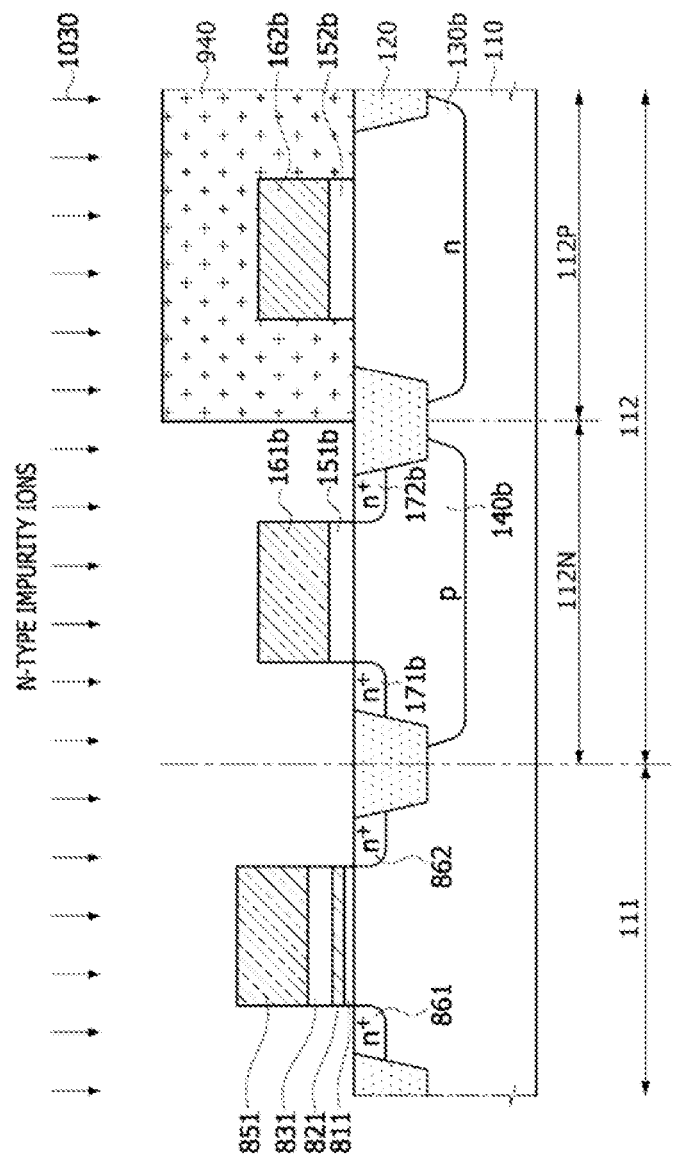

Referring to FIG. 25, a fourth mask pattern 940 may be formed on the PMOS transistor region 112P of the substrate 110 to cover the second gate electrode 162b. In some embodiments, the fourth mask pattern 940 may be formed of a photoresist layer.

Subsequently, N-type impurity ions may be implanted into the substrate 110 using the fourth mask pattern 940 as an ion implantation mask, as indicated by the arrows 1030 of FIG. 25. As a result of the ion implantation process, an N-type source region 861 and an N-type drain region 862 of the charge trap memory cell may be formed in an upper region of the first region 111 of the substrate 110, and an N-type source region 171b and an N-type drain region 172b of the NMOS transistor may be formed in an upper region of the NMOS transistor region 112N, i.e., the second well region 140b of the substrate 110. After the ion implantation process for forming the N-type source/drain regions 861, 862, 171b and 172b, the fourth mask pattern 940 may be removed.

Referring to FIG. 26, a fifth mask pattern 950 may be formed on the first region 111 and the NMOS transistor region 112N of the substrate 110 to cover the control gate electrode 851 and the first gate electrode 161b. In some embodiments, the fifth mask pattern 950 may be formed of a photoresist layer.

Subsequently, P-type impurity ions may be implanted into the substrate 110 using the fifth mask pattern 950 as an ion implantation mask, as indicated by arrows 1040 of FIG. 26. As a result of the ion Implantation process, a P-type source region 181b and a P-type drain region 182b of the PMOS transistor may be formed in an upper region of the PMOS transistor region 112P, i.e., the first well region 130b of the substrate 110. After the ion implantation process for forming the P-type source/drain regions 181b and 182b, the fifth mask pattern 950 may be removed.

The embodiments of the present disclosure have been disclosed above for illustrative purposes. Those of ordinary skill in the art will appreciate that various modifications, additions, and substitutions are possible, without departing from the scope and spirit of the present disclosure as disclosed in the accompanying claims.

What is claimed is:

1. A method of fabricating an embedded electronic device including charge trap memory cells, the method comprising:
    forming a tunnel insulation layer, a charge trap layer and a sacrificial Insulation layer on a substrate having a first region and a second region;
    selectively removing the tunnel insulation layer, the charge trap layer and the sacrificial Insulation layer which are stacked on the second region of the substrate;
    forming a well region in an upper region of the second region of the substrate;
    removing the sacrificial insulation layer remaining over the first region to expose the charge trap layer remaining over the first region; and
    forming a blocking insulation layer and a gate insulation layer on the exposed charge trap layer over the first region and on the second region of the substrate, respectively.

2. The method of claim 1,
    wherein the first region is a region on which the charge trap memory cells are formed; and
    wherein the second region is a region on which logic devices are formed.

3. The method of claim 1,
    wherein each of the tunnel insulation layer and the sacrificial insulation layer is formed of a silicon oxide layer, a silicon oxynitride layer or a combination thereof; and
    wherein the charge trap layer is formed of a silicon nitride layer.

4. The method of claim 1, wherein the selectively removing of the tunnel insulation layer, the charge trap layer and the sacrificial insulation layer includes:
    forming a first mask pattern on the sacrificial Insulation layer so that the sacrificial insulation layer on the second region is selectively exposed; and
    etching the sacrificial insulation layer, the charge trap layer and the tunnel insulation layer using the first mask pattern as an etch mask.

5. The method of claim 1, wherein the forming of the well region includes:
    forming a second mask pattern on a portion of the sacrificial insulation layer over the first region and on a first portion of the second region to expose a second portion of the second region;
    implanting impurity ions into the substrate using the second mask pattern as an ion implantation mask to form a first well region of a first conductivity in an upper region of the second portion of the second region; and
    removing the second mask pattern.

6. The method of claim 5, further comprising:
    forming a third mask pattern on the portion of the sacrificial insulation layer over the first region and on the second portion of the second region to expose the first portion of the second region;
    implanting impurity ions into the substrate using the third mask pattern as an ion implantation mask to form a second well region of a second conductivity in an upper region of the first portion of the second region; and
    removing the third mask pattern.

7. The method of claim 1, wherein the blocking insulation layer and the gate insulation layer are formed using a thermal oxidation process.

8. The method of claim 1, further comprising:
    forming a conductive layer on the blocking insulation layer and the gate insulation layer;
    patterning the conductive layer to form a control gate electrode over the first region and a gate electrode over the second region; and
    patterning the blocking insulation layer, the charge trap layer, the tunnel insulation layer and the gate insulation layer to form a tunnel insulation pattern, a charge trap pattern and a blocking insulation pattern which are located under the control gate electrode, and to form a gate insulation pattern which is located under the gate electrode.

* * * * *